(12) United States Patent
Tan et al.

(10) Patent No.: US 8,896,072 B2
(45) Date of Patent: Nov. 25, 2014

(54) CHANNEL SURFACE TECHNIQUE FOR FABRICATION OF FINFET DEVICES

(71) Applicants: Chung Foong Tan, Singapore (SG); Eng Huat Toh, Singapore (SG); Jae Gon Lee, Singapore (SG); Sanford Chu, Singapore (SG)

(72) Inventors: Chung Foong Tan, Singapore (SG); Eng Huat Toh, Singapore (SG); Jae Gon Lee, Singapore (SG); Sanford Chu, Singapore (SG)

(73) Assignee: Globalfoundries Singapore Pte, Ltd., Singapore (SG)

( * ) Notice: Subject to any disclaimer, the term of this patent is extended or adjusted under 35 U.S.C. 154(b) by 0 days.

(21) Appl. No.: 13/736,546

(22) Filed: Jan. 8, 2013

(65) Prior Publication Data

US 2013/0187242 A1 Jul. 25, 2013

Related U.S. Application Data

(62) Division of application No. 13/043,323, filed on Mar. 8, 2011, now Pat. No. 8,349,692.

(51) Int. Cl.
*H01L 29/78* (2006.01)
*H01L 29/66* (2006.01)

(52) U.S. Cl.
CPC ...... *H01L 29/7853* (2013.01); *H01L 29/66795* (2013.01)
USPC ........................................... 257/410; 257/288

(58) Field of Classification Search
USPC .................................................. 257/410, 288
See application file for complete search history.

(56) References Cited

U.S. PATENT DOCUMENTS

| 7,547,637 B2 * | 6/2009 | Brask et al. ............... 438/717 |
| 8,071,983 B2 | 12/2011 | Brask et al. |
| 8,084,818 B2 | 12/2011 | Shaheen et al. |

* cited by examiner

*Primary Examiner* — Long Pham
(74) *Attorney, Agent, or Firm* — Robert D. McCutcheon

(57) ABSTRACT

A FinFET (p-channel) device is formed having a fin structure with sloped or angled sidewalls (e.g., a pyramidal or trapezoidal shaped cross-section shape). When using conventional semiconductor substrates having a (100) surface orientation, the fin structure is formed in a way (groove etching) which results in sloped or angled sidewalls having a (111) surface orientation. This characteristic substantially increases hole mobility as compared to conventional fin structures having vertical sidewalls.

20 Claims, 6 Drawing Sheets

CHANNEL SURFACE TECHNIQUE FOR FABRICATION OF FINFET DEVICES

CROSS-REFERENCE TO RELATED APPLICATION

The present application is a divisional of U.S. patent application Ser. No. 13/043,323 filed Mar. 8, 2011.

TECHNICAL FIELD

The present disclosure relates generally to the manufacture of semiconductor devices, and more particularly, to the fabrication and manufacture of a novel Fin field-effect transistor (FinFET).

BACKGROUND

Fin field-effect transistors (FinFET) are multi-gate transistors where the conducting channel is wrapped around a thin piece of silicon, often referred to and configured as a "fin." The dimensions of the fin structure determine the effective channel width of the transistor. Typically, the source, drain and gate are formed extending above the substrate, and the FinFET is viewed as a MOSFET device with a folded gate feature. FinFETs provide a promising candidate for small line width technology because of their excellent short channel effect control, scalability and higher current drive per unit width.

Turning to FIGS. 1A and 1B, there is illustrated a conventional prior art FinFET device 100 in FIG. 1A. FIG. 1B illustrates the relevant cross-section of the prior art FinFET device 100 along line 1B-1B. The device 100 includes a first source/drain (S/D) region 102, a second S/D region 104, a fin structure 106 and a gate electrode 108, all disposed on a substrate 120. The fin structure 106 includes a first fin portion 106a, a second fin portion 106b, a channel portion 106c and vertical sidewalls 107. Disposed between the channel portion 106c and the gate electrode 108 is a gate (insulator) 110 (shown in FIG. 1B).

As will be appreciated, a portion of the gate electrode 108 that normally overlies the channel portion 106c has been omitted in FIG. 1A (but is shown in FIG. 1B) to facilitate an understanding of the present disclosure. It will be understood that the first fin portion 106a forms part of the S/D region 102 while the second fin portion 106b forms part of the S/D region 104. In addition, as shown in FIG. 1B, a relatively thick dielectric layer 112 is disposed on top of the channel portion 106c between the channel portion 106c and the gate electrode 108.

It will also be understood that, depending on the type of FET desired, the S/D regions 102, 104 (and the exposed portions of the fin structure 106a, 106b not under the gate) will be doped with either n-type or p-type impurities, while the channel portion 106c beneath the gate electrode 108 will be doped with the opposite type—either p-type or n-type, respectively (usually doped as part of the initial starting substrate material).

Conventional MOS fabrication typically utilizes a silicon substrate having (100) surface orientation (such as in the FinFET device 100). Utilization of the (100) surface orientation is preferred due to the large application of nFETs and the higher electron mobility in the nFETs resulting from the (100) surface orientation. However, the (100) surface orientation limits hole mobility and thus degrades pFET performance.

Accordingly, there is a need for new p-channel FinFET device and structure (and methods of manufacture/fabrication) that increases hole mobility and enhances pFET performance.

SUMMARY

In accordance with one advantageous embodiment, there is provided a Fin field-effect transistor (FinFET) device including a substrate and first and second source/drain (S/D) regions of a first conductivity type disposed on the substrate. A fin channel structure of semiconductor material is disposed on the substrate and extends between the first and second S/D regions. The fin channel structure includes a first fin portion, a second fin portion, and a channel portion, where the channel portion is of a second conductivity type. A gate structure is disposed over the channel portion, and the gate structure includes a gate dielectric and a gate electrode. The fin channel structure includes first and second angled sidewalls.

In accordance with one another advantageous embodiment, there is provided a p-channel Fin field-effect transistor (FinFET) device that includes a substrate and first and second source/drain (S/D) regions of p-type conductivity disposed on the substrate. A fin channel structure of semiconductor material is disposed on the substrate, extends between the first and second S/D regions, and includes a first fin portion, a second fin portion, and a channel portion of n-type conductivity. The fin structure further includes a top surface and two sidewalls each having a sidewall surface. A gate structure disposed over the top surface of the channel portion includes a gate dielectric and a gate electrode. The two sidewall surfaces of the channel portion have a (111) surface orientation and the top surface of the channel portion has a different surface orientation.

In another embodiment, there is provided a method of manufacturing or fabricating a p-channel Fin field-effect transistor (Fin FET). A substrate of semiconductor material having a (100) surface orientation is provided, and a mask layer is formed on the substrate to expose portions of the substrate. Portions of the substrate are selectively removed to form a fin channel structure having sloped sidewalls, the sloped sidewalls having a (111) surface orientation. A gate dielectric layer if formed over at least a portion of the fin channel structure, and a gate electrode layer is formed over the gate dielectric layer.

The foregoing has outlined rather broadly the features and technical advantages of the present disclosure so that those skilled in the art may better understand the detailed description that follows. Additional features and advantages of the present disclosure will be described hereinafter that form the subject of the claims. Those skilled in the art should appreciate that they may readily use the concept and the specific embodiment(s) disclosed as a basis for modifying or designing other structures for carrying out the same or similar purposes of the present disclosure. Those skilled in the art should also realize that such equivalent constructions do not depart from the spirit and scope of the claimed invention in its broadest form.

Before undertaking the Detailed Description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figures 1A, 1B:
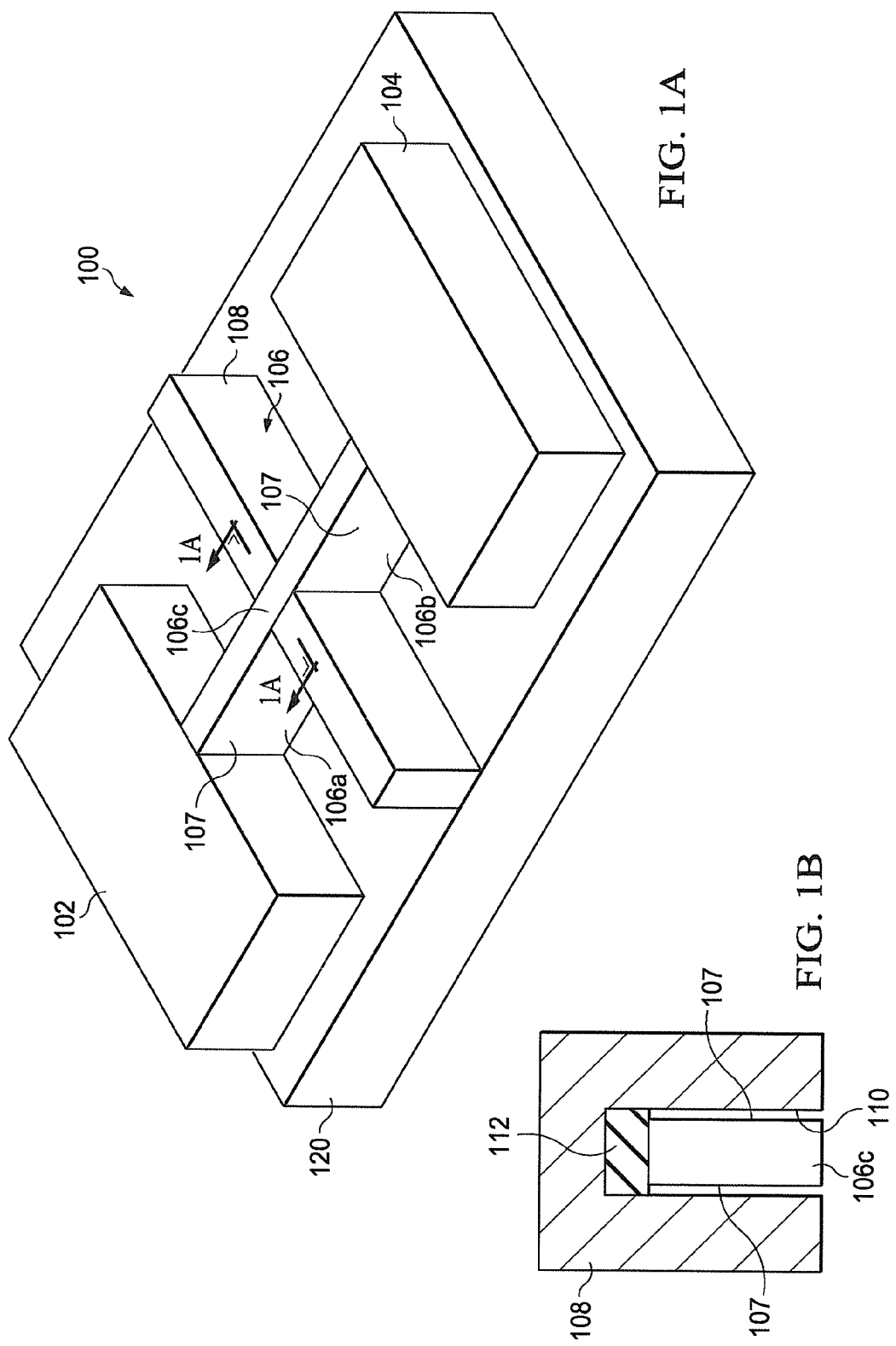
FIGS. 1A and 1B are diagrams illustrating a three dimensional rendering of the relevant portions of a conventional prior art FinFET and a cross-section of the channel along lines A-A.

The present disclosure describes a novel channel and gate structure for use in a p-channel FinFET device, and a method of manufacturing FinFET devices to form this structure and device. The method forms a channel having a pyramidal or trapezoidal cross-section. In one embodiment, this method converts the surface orientation of the channel sidewalls from a (100) surface orientation to a (111) surface orientation. This channel transformation increases hole mobility for a p-channel FinFET, and in one embodiment, increases hole mobility by about 40 percent. This method and gate structure increases performance of p-channel FinFETs. This provides a transistor inversion channel on a surface having a (111) surface orientation which is more favorable for carrier transport mobility across the channel of the transistor.

FIGS. 1 through 10 and the various embodiments used to describe the principles of the present disclosure in this patent document are by way of illustration only and should not be construed in any way to limit its scope. Those skilled in the art will understand that the principles described herein may be implemented in any type of suitably arranged FET device.

To simplify the drawings, reference numerals from previous drawings will sometimes not be repeated for structures that have already been identified.

Figure 2A:
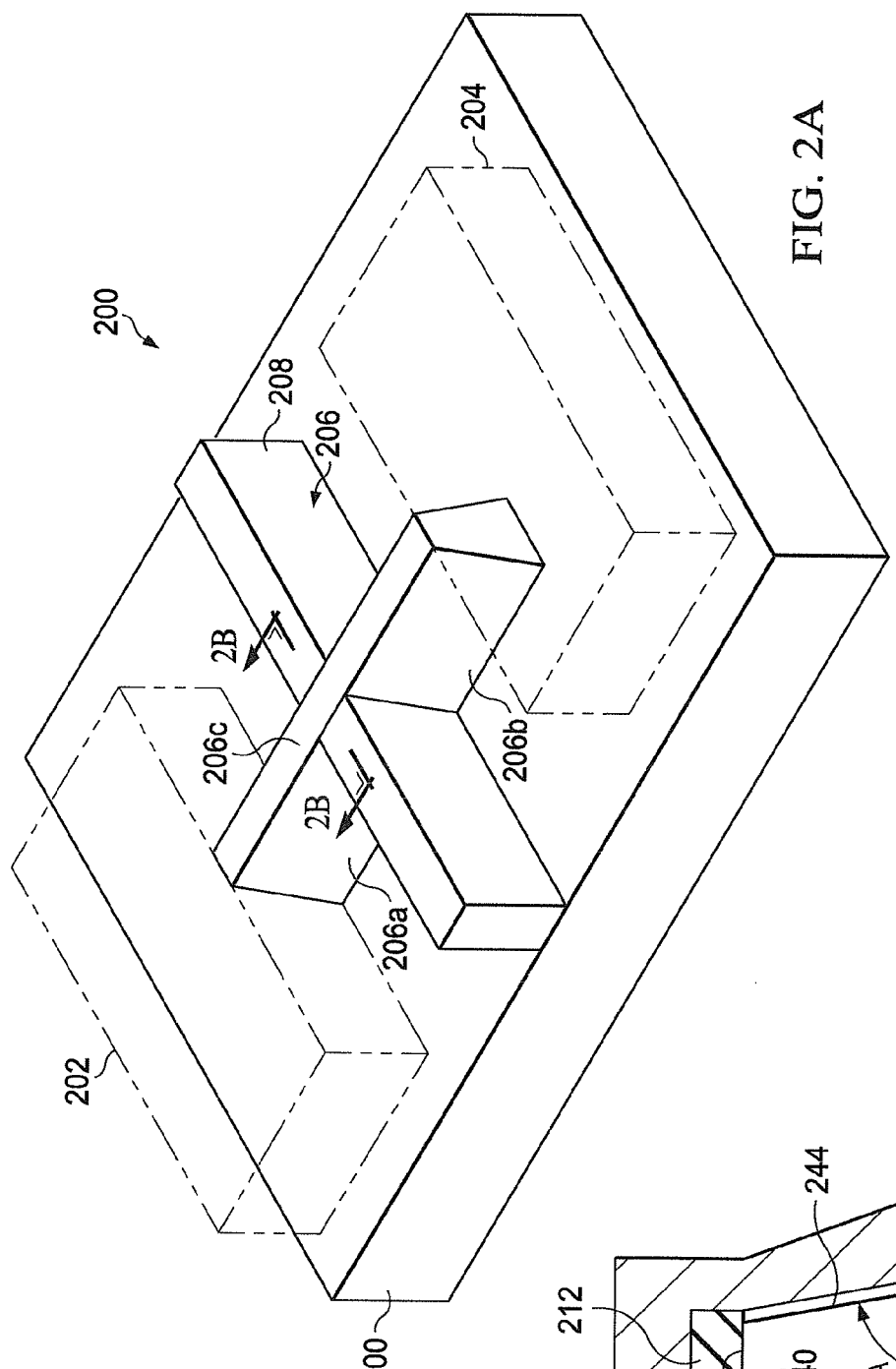
FIGS. 2A and 2B are diagrams illustrating a three-dimensional rendering, and cross sectional side view, respectively, of a p-channel FinFET in accordance with the present disclosure.
Figure 2B:
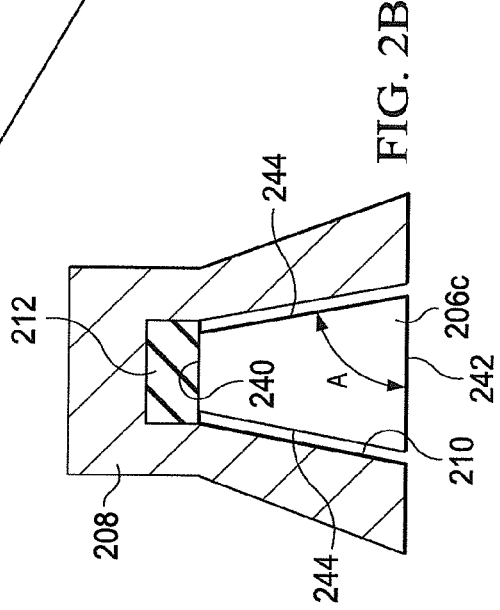

Turning to FIGS. 2A and 2B, these are diagrams illustrating a three-dimensional rendering, and cross sectional view along line 2B-2B, respectively, of a FinFET device 200 with a channel structure and gate structure according to one embodiment of the present disclosure. As will be appreciated, only the relevant portions of a FinFET device 200 are shown, and the source and drain contacts (and actual gate contact) are not illustrated.

The FinFET device 200 includes a substrate 300, a fin channel structure 206 disposed above the substrate 300, a gate electrode (or contact) 208 disposed around a portion of the fin channel structure 206. The fin channel structure 206 includes a first fin portion 206a, a second fin portion 206b and a channel portion 206c. The substrate 300 may be formed of any suitable dielectric or insulating material, and in one embodiment, the substrate 300 is formed of silicon oxide, and is sometimes referred to as a buried oxide layer (BOX).

The FinFET device 200 includes first and second source/drain (S/D) regions 202, 204—shown in dotted lines. It will be understood that the first fin portion 206a forms part of the S/D region 202 while the second fin portion 206b forms part of the S/D region 204. Disposed between the fin channel portion 206c and the gate electrode 208 is a gate insulator or dielectric 210 (shown in FIG. 2B). As will be appreciated, a portion of the gate electrode 208 that normally overlies the fin channel portion 206c has been omitted in FIG. 2A (but is shown in FIG. 2B) to further facilitate an understanding of the present disclosure. In addition, as shown in FIG. 2B, a relatively thick dielectric layer 212 is disposed on top of the channel 206 between the channel 206 and the gate electrode 208. In this FinFET device 200, the gate electrode 208 may be formed of polysilicon or amorphous silicon, or some other suitable conductive material(s), such as metal or metal alloys.

It will be understood that, depending on the type of FET desired, the S/D regions 202, 204 (and the exposed portions of the fin structure 206a, 206b not under the gate) will be doped with either n-type or p-type impurities (conductivity type), while the channel portion 206c beneath the gate electrode 208 will be doped with the opposite type—either p-type or n-type, respectively (usually doped as part of the initial starting substrate material).

As shown in FIGS. 2A and 2B, the fin channel structure 206 has a pyramidal or trapezoidal shape, and includes a top surface or portion 240, a bottom surface or portion 242, and two sidewalls 244. As shown, the width dimension of the base portion 242 is greater than the width dimension of the top portion 240, resulting in slanted or sloped (angled) sidewalls 244. As illustrated in FIG. 2B, the sidewalls 244 have an angle A. Angle A may range from between about 30 degrees to about 70 degrees, from about 40 degrees to about 65 degrees, or from about 50 degrees to about 60 degrees. In one embodiment, the angle A is about 55 degrees. The angle A will depend at least in part on etch chemistry (described below).

In one embodiment, the fin channel structure 206 and S/D regions 202, 204 are formed from a semiconductor substrate material, such as silicon, having a surface orientation of (100). Through semiconductor fabrication processing—as will be described further below—the surface orientation of the sidewalls 244 is transformed or converted from (100) to (111). Notably, the surface of the top portion 240 remains with the (100) surface orientation. By converting or transforming the surface orientation of the sidewalls 244 to the (111) surface orientation, hole mobility increases significantly. Thus, this particular channel and gate structure 206, 208 is desirable for use in p-channel FinFETs.

Figure 3:
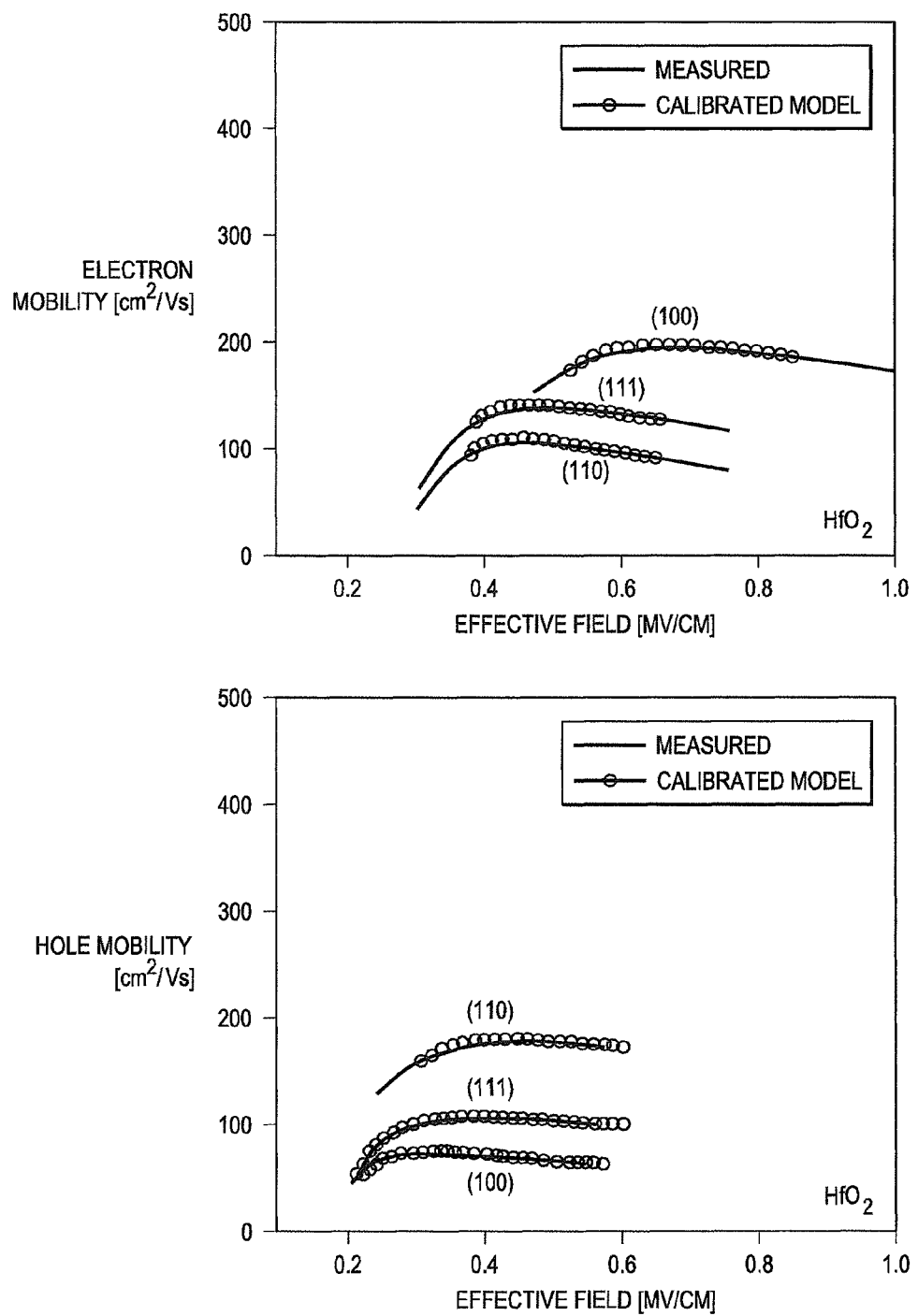
FIG. 3 includes two diagrams illustrating electron and hole mobility for three different surface orientations of semiconductor substrate material.

In one embodiment, the gate dielectric 208 is formed of hafnium oxide ($HfO_2$), and may optionally include a thin interfacial layer (e.g., silicon oxide, silicon nitride). Turning to FIG. 3, there are shown two graphs illustrating electron mobility and hole mobility for substrate material having (100), (111) and (110) surface orientation (using $HfO_2$). These graphs and additional information may be found in Leland Chang, "CMOS Circuit Performance Enhancement by Surface Orientation Optimization", IEEE TRANS. ON ELECTRON DEVICES, Vol. 51, No. 10, Oct., 2004, which is incorporated herein by reference. As illustrated, the (111) surface orientation has about a 40 percent increase in hole mobility compared to the (100) surface orientation. Notably, the (111) surface orientation decreases electron mobility as compared to the (100) surface orientation.

Figure 6:
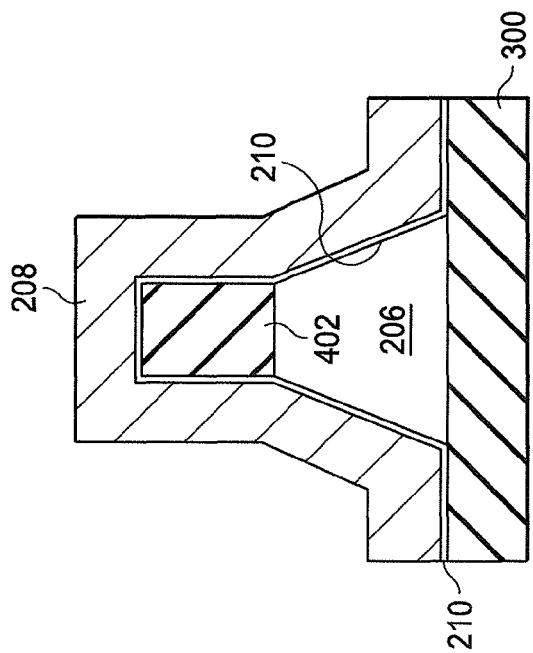
FIGS. 4-6 are diagrams that illustrate a series of steps of one embodiment of a method or process for manufacturing the FinFET device shown in FIG. 2A.
Figure 4:
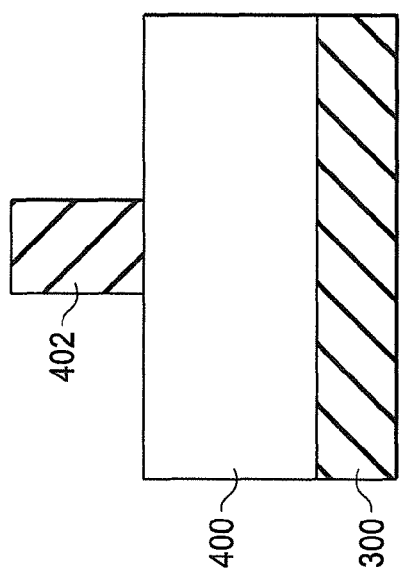
Figure 5:
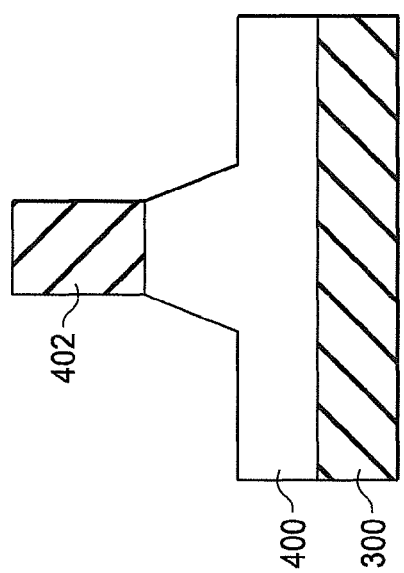

FIGS. 4 through 6 are diagrams that illustrate a series of relevant steps of one embodiment of a method or process for manufacturing the FinFET device 200 (shown in FIGS. 2A and 2B).

Now turning to FIG. 4, a silicon-on-insulator (SOI) or bulk semiconductor material substrate 400 is provided. The substrate 400 has a (100) surface orientation. In one embodiment, the substrate 400 includes an underlying substrate, such as a buried oxide (BOX) layer 300, and the following description of the fabrication process will be described and illustrated using a SOI substrate (with BOX 300). A hardmask 402 is formed on the substrate 400 for eventual etching/formation of the fin channel structure 206. Any suitable mask material may be used, and for example, the hard mask material may be silicon oxide or silicon nitride or a layer including both where one will act as an etchstop of the other.

Now turning to FIG. 5, the substrate 400 with the hardmask 402 undergoes a "grooving" etch process which selectively removes portions of the substrate material 400 to form the fin channel structure 206. This process is a highly selective faceting etch of the substrate 400. Suitable etch chemical(s) or solutions are those that will result in the desired groove etching process which includes having a low or near zero etch rate on (111) facets and a high etch rate on (100) facets. Utilizing this etching process, the sidewalls 244 are formed as shown (and as described previously). This may be accomplished by using solutions of tetramethylammonium hydroxide (TMAH) or ammonium hydroxide (AH). For example, measured etch rates for a 25% solution is about 0.272 (0.51 um/minute normalized to (110) surface) for a (100) surface orientation and about 0.009 (0.02 um/minute normalized to (110) orientation) for a (111) surface orientation.

It will be understood that the FIG. 5 illustrates the substrate 400 prior to completion of the grooving etch process. As shown, the flat surfaces of the substrate 400 maintain the original (100) surface orientation, while the sloped sidewalls 244 of the fin channel structure 206 are transformed or converted to, or generate, a (111) surface orientation. The grooving etch process proceeds until the BOX substrate 300 is reached.

With reference to FIG. 6, a dielectric material is formed over the surfaces of the sidewalls 244 (and may be formed over the hardmask 402) which forms the gate dielectric 210. Thereafter, the gate electrode 208 is formed over the gate dielectric 210 as shown. In one embodiment, the gate dielectric material is a high-K material, such as $HfO_2$. In this embodiment, the gate electrode may be formed of any suitable conductive material, such as amorphous silicon, polysilicon, metal or metal alloys. In another embodiment, the gate dielectric 210 may be formed using a more conventional gate oxide, and the gate electrode 208 may be formed of polysilicon (doped or undoped).

After the gate stack of the FinFET device 200 is formed as shown in FIG. 6, a conventional or typical FinFET fabrication process generally follows (which is not described herein, and is unnecessary for the understanding of the teachings herein).

FIGS. 7 through 10 are diagrams that illustrate a series of relevant steps of one embodiment of another method or process for manufacturing the gate stack of the p-channel FinFET device 200 (shown in FIGS. 2A and 2B) and a gate stack of an re-channel FinFET device on the same substrate.

Figure 7:
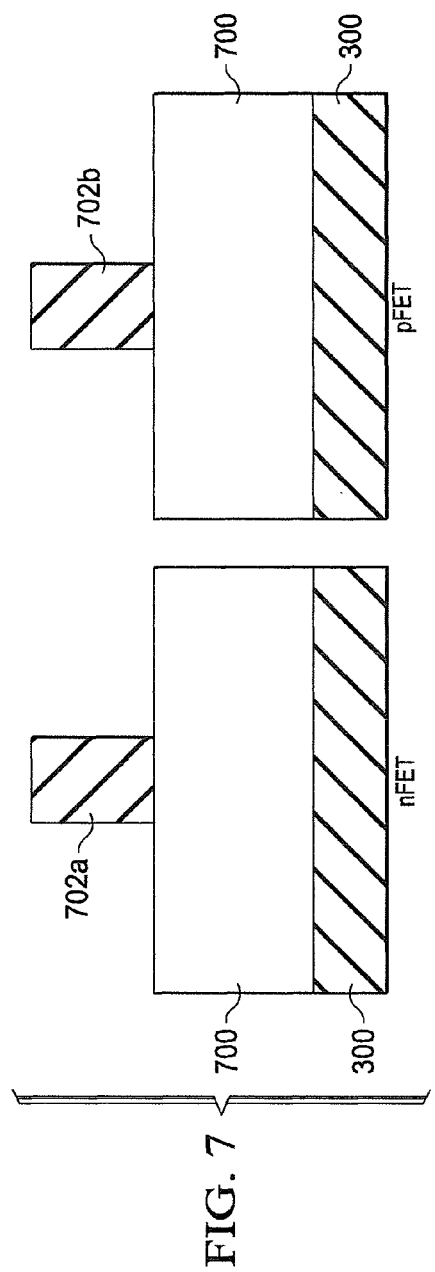
FIGS. 7-10 are diagrams that illustrate a series of steps of another embodiment similar to the method or process shown in FIGS. 4-6 for manufacturing the FinFET device shown in FIG. 2A, but with the inclusion of an adjacent n-channel FinFET.

Now turning to FIG. 7, a silicon-on-insulator (SOI) or bulk semiconductor material substrate 700 (similar to the substrate 400) is provided. The substrate 700 has a (100) surface orientation. In one embodiment, the substrate 700 includes an underlying substrate, such as the buried oxide (BOX) layer 300, and the following description of the fabrication process will be described and illustrated using a SOI substrate (with BOX). A hardmask 702a, 702b is formed on the substrate 700 for eventual etching/formation of a fin channel structure for the n-channel FinFET and the fin channel structure 206 for the p-channel FinFET 200.

Figure 8:
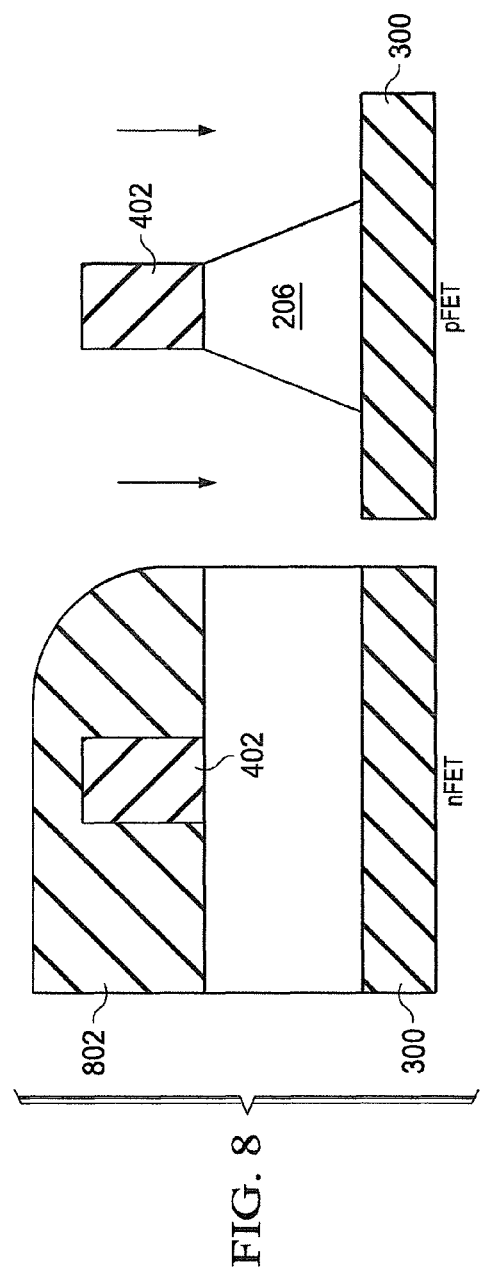

Now turning to FIG. 8, a suitable etch resistant layer (mask) 802 is formed above that portion of the substrate 700 that will include the n-channel FinFET—as shown. Two examples of suitable etch resistant materials include photoresist and oxide. After formation of the etch resistant layer 802, the grooving etch process described above with respect to FIG. 5 is performed. As will be appreciated, the etch resistant layer 802 will be any suitable material resistant to the etch chemistry utilized in the grooving etch process that forms the fin channel structure 206 of the p-channel FinFET.

Figure 9:
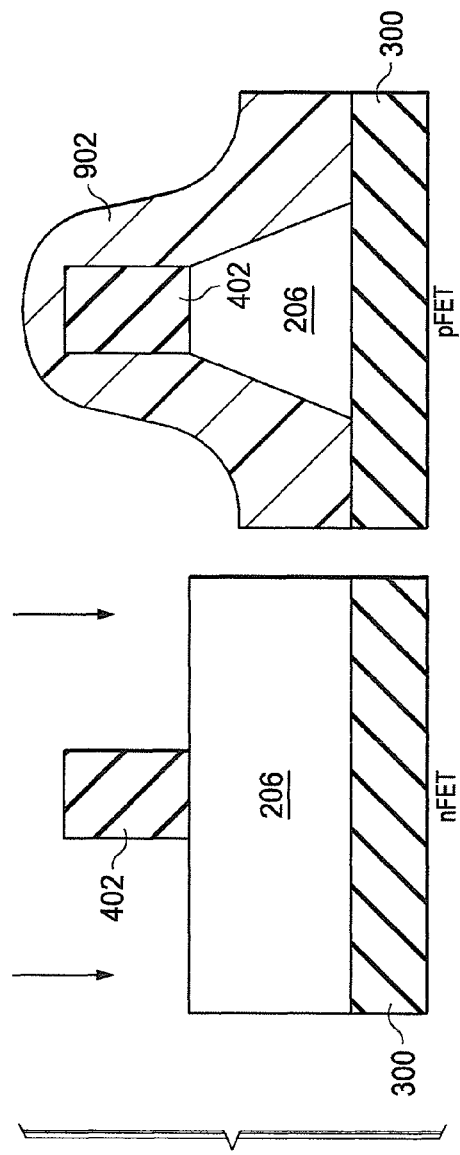

Turning now to FIG. 9, after the grooved fin channel structure 206 of the p-channel FinFET 200 is formed, another suitable etch resistant layer (mask) 902 is formed above that portion of the substrate 700 that will include the p-channel FinFET—as shown. Two examples of suitable etch resistant materials include photoresist and oxide. After formation of the etch resistant layer 902, the fin channel structure (having vertical sidewalls) underlying the hardmask 702a is formed by removal/etching of selected portions of the substrate 700. In one embodiment, the etching process may a reactive ion etching (REI) process. Any suitable technique maybe utilized to form the fin channel structure having vertical (non-sloping) sidewalls. As will be appreciated, the etch resistant layer 902 will be any suitable material resistant to the etching process performed to form the fin channel structure of the n-channel FinFET. It will be understood that removal of the etch resistant layer 802 may occur either before or after formation of the etch resistant layer 902.

Figure 10:
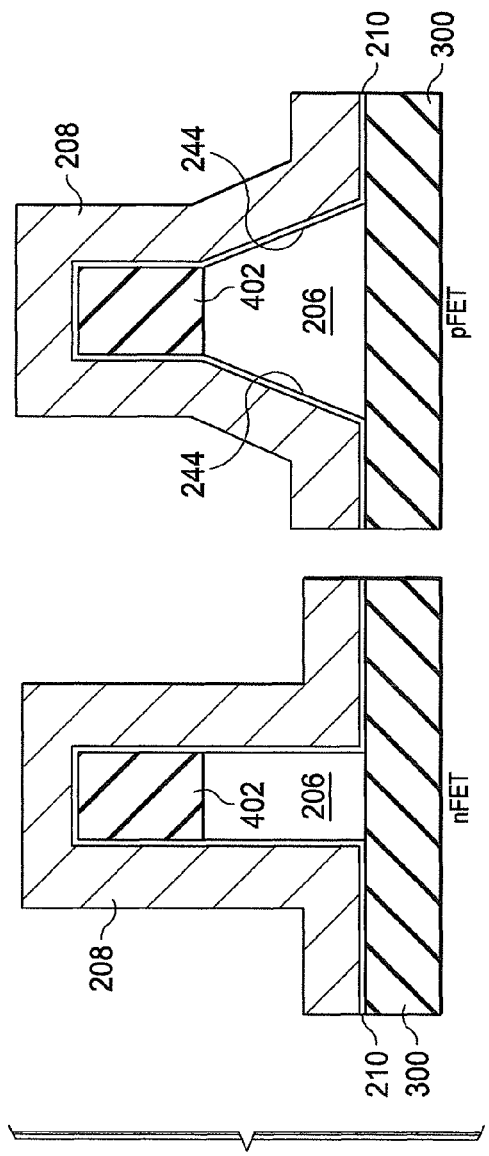

With reference to FIG. 10, a dielectric material is formed on the surfaces of the sidewalls 244 (and may be formed over the hardmask 702b) of the p-channel FinFET 200 and on the surfaces of the sidewalls (and may be formed over the hardmask 702a) of the n-channel FinFET to form the gate dielectric 210. Thereafter, the gate electrode 208 is formed over the gate dielectric 210 as shown. In one embodiment, the gate dielectric material is a high-K material, such as $HfO_2$. In this embodiment, the gate electrode 208 may be formed of any suitable conductive material, such as amorphous silicon, polysilicon, metal or metal alloys. In another embodiment, the gate dielectric 210 may be formed using a more conventional gate oxide, and the gate electrode 208 may be formed of polysilicon (doped or undoped).

It will be understood that the gate dielectric 210 of the p-channel FinFET and the gate dielectric of the n-channel FinFET may be the same or different material and/or may be formed in a single or multiple steps.

After the gate stacks of the p-channel FinFET device 200 and the n-channel FinFET device are formed as shown in FIG. 10, a conventional or typical FinFET fabrication process generally follows (which is not described herein, and is unnecessary for the understanding of the teachings herein). Though not shown in FIGS. 7-10, both the n-channel FinFET device and the p-channel FinFET device 200 resulting from the overall process will include S/D regions as illustrated in FIGS. 1A/1B and 2A/2B, respectively.

As will be appreciated, the n-channel FinFET partially formed as described with respect to FIGS. 7-10 will resemble, and include the structures of, the FinFET device 100 shown in FIGS. 1A and 1B. Thus, the n-channel FinFET device will have a (100) surface orientation on the sidewalls of its fin channel structure, while the p-channel FinFET will have a (111) surface orientation on the sidewalls of its fin channel structure. In this manner of fabrication, the n-channel FinFETs on a substrate will have high electron mobility, while the p-channel FinFETs will have high hole mobility.

Additional benefits and advantages may be obtained by the herein described p-channel FinFET device 200 and the method of fabrication. In the conventional p-channel FinFET device as shown in FIGS. 1A and 1B, the fin channel orientation of the fin structure is (110). In the novel FinFET device 200 shown in FIGS. 2A and 2B, the fin channel orientation of the fin structure is (100)—which is more favorable for p-channel FinFET devices. Though a physical increase in the width of the channel (device) occurs as compared to a device having vertical sidewalls. This increase in size allows a larger drive current in the device. As a result, the devices can be made smaller but still have about the same amount of current drive capability. By having a sloping channel sidewall surfaces, if the footprint area does not change, there exists a much wider area for current flow from the source to the drain. Alternatively, this allows achievement of the same current flow but with a smaller transistor footprint.

It will be understood that well known processes have not been described in detail and have been omitted for brevity. Although specific steps, structures and materials may have been described, the present disclosure may not limited to these specifics, and others may substituted as is well understood by those skilled in the art, and various steps may not necessarily be performed in the sequences shown.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A Fin field-effect transistor (FinFET) device comprising:
    a substrate;
    first and second source/drain (S/D) regions of a first conductivity type disposed above the substrate;
    a fin channel structure of semiconductor material disposed above the substrate and extending between the first and second S/D regions, the fin channel structure including a first fin portion, a second fin portion, and a channel portion, the channel portion of a second conductivity type, and the fin channel structure having a bottom surface with a width greater than a width of a top surface;
    a gate structure disposed over the channel portion, the gate structure including a gate dielectric and a gate electrode; and
    wherein the fin channel structure comprises first and second angled sidewalls.

2. The FinFET device in accordance with claim 1 wherein the fin channel structure has a trapezoidal cross-section shape.

3. The FinFET device in accordance with claim 1 wherein surfaces of the first and second angled sidewalls have (111) surface orientation.

4. The FinFET device in accordance with claim 3 wherein the top surface of the fin channel structure has a (100) surface orientation.

5. The FinFET device in accordance with claim 3 wherein the channel portion has a (100) channel orientation.

6. The FinFET device in accordance with claim 3 wherein the first and second angled sidewalls each have an angle between about 50 degrees and 60 degrees.

7. The FinFET device in accordance with claim 3 wherein the gate dielectric comprises high-K dielectric material.

8. The FinFET device in accordance with claim 1 wherein the first and second angled sidewalls each have an angle between about 40 degrees and 65 degrees.

9. The FinFET device in accordance with claim 1 wherein the first and second angled sidewalls each have an angle between about 50 degrees and 60 degrees.

10. A p-channel Fin field-effect transistor (FinFET) device comprising:
    a substrate;
    first and second source/drain (S/D) regions of p-type conductivity disposed above the substrate;
    a fin channel structure of semiconductor material disposed on the substrate and extending between the first and second S/D regions, the fin channel structure including a first fin portion, a second fin portion, and a channel portion of n-type conductivity having a top surface, a bottom surface and two sidewalls each having a sidewall surface, and wherein the bottom surface has a width greater than a width of the top surface;
    a gate structure disposed over the top surface of the channel portion, the gate structure including a gate dielectric and a gate electrode; and
    wherein the two sidewall surfaces of the channel portion have a (111) surface orientation and the top surface of the channel portion has a different surface orientation.

11. The FinFET device in accordance with claim 10 wherein the fin channel structure has a trapezoidal cross-section shape.

12. The FinFET device in accordance with claim 10 wherein each of the two sidewall surfaces have an angle of between about 40 degrees and 65 degrees.

13. The FinFET device in accordance with claim 12 wherein each of the two sidewall surfaces have an angle between about 50 degrees and 60 degrees.

14. The FinFET device in accordance with claim 13 wherein the gate dielectric comprises hafnium oxide.

15. The FinFET device in accordance with claim 12 wherein the top surface of the channel portion has a (100) surface orientation.

16. A Fin field-effect transistor (FinFET) device comprising:
    a substrate of semiconductor material having a (100) surface orientation;
    first and second source/drain (S/D) regions of a first conductivity type;
    a fin channel structure of semiconductor material disposed on the substrate and extending between the first and second S/D regions, the fin channel structure including a channel portion of a second conductivity-type, the channel portion having a top surface, a bottom surface and two sidewalls each having a sidewall surface, and wherein the bottom surface has a width greater than a width of the top surface;

a gate structure disposed over the top surface of the channel portion, the gate structure including a gate dielectric and a gate electrode; and wherein the two sidewall surfaces of the channel portion have a (111) surface orientation and the top surface of the channel portion have a (100) surface orientation.

17. The FinFET device in accordance with claim 16 wherein the fin channel structure has a trapezoidal cross-section shape.

18. The FinFET device in accordance with claim 16 wherein each of the two sidewall surfaces have an angle of between about 40 degrees and 65 degrees.

19. The FinFET device in accordance with claim 18 wherein the gate dielectric comprises hafnium oxide.

20. The FinFET device in accordance with claim 16 wherein the channel portion has a (100) channel orientation.

* * * * *